(12) United States Patent
Wang et al.

(10) Patent No.: US 8,877,598 B2
(45) Date of Patent: Nov. 4, 2014

(54) METHOD OF LITHOGRAPHY PROCESS WITH AN UNDER ISOLATION MATERIAL LAYER

(75) Inventors: Chung-Ming Wang, Chiayi (TW); Yu Lun Liu, Beidou Township, Changhua County (TW); Chia-Chu Liu, Shin-Chu (TW); Ya Hui Chang, Hsinchu (TW); Kuei-Shun Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 221 days.

(21) Appl. No.: 13/486,050

(22) Filed: Jun. 1, 2012

(65) Prior Publication Data

US 2013/0323898 A1    Dec. 5, 2013

(51) Int. Cl.
*H01L 21/336*   (2006.01)
*H01L 21/4763*  (2006.01)
*H01L 29/786*   (2006.01)
*H01L 27/12*    (2006.01)

(52) U.S. Cl.
CPC ....... *H01L 29/78606* (2013.01); *H01L 27/1292* (2013.01)

USPC ............... 438/305; 438/303; 438/595

(58) Field of Classification Search
USPC ........................... 438/303, 305, 595
See application file for complete search history.

(56) References Cited

U.S. PATENT DOCUMENTS

| | | | |
|---|---|---|---|
| 7,052,946 B2* | 5/2006 | Chen et al. | 438/199 |
| 7,465,618 B2* | 12/2008 | Hayashi et al. | 438/197 |
| 2010/0181618 A1* | 7/2010 | Meunier-Bellard et al. | 257/344 |
| 2010/0200897 A1* | 8/2010 | Heringa et al. | 257/288 |
| 2011/0129971 A1* | 6/2011 | Kronholz et al. | 438/230 |
| 2011/0244670 A1* | 10/2011 | Richter et al. | 438/585 |
| 2012/0153398 A1* | 6/2012 | Baars et al. | 257/369 |

* cited by examiner

*Primary Examiner* — Luan C Thai
(74) *Attorney, Agent, or Firm* — Haynes and Boone, LLP

(57) ABSTRACT

A method of forming a integrated circuit pattern. The method includes forming gate stacks on a substrate, two adjacent gate stacks of the gate stacks being spaced away by a dimension G; forming a nitrogen-containing layer on the gate stacks and the substrate; forming a dielectric material layer on the nitrogen-containing layer, the dielectric material layer having a thickness T substantially less than G/2; coating a photoresist layer on the dielectric material layer; and patterning the photoresist layer by a lithography process.

20 Claims, 7 Drawing Sheets

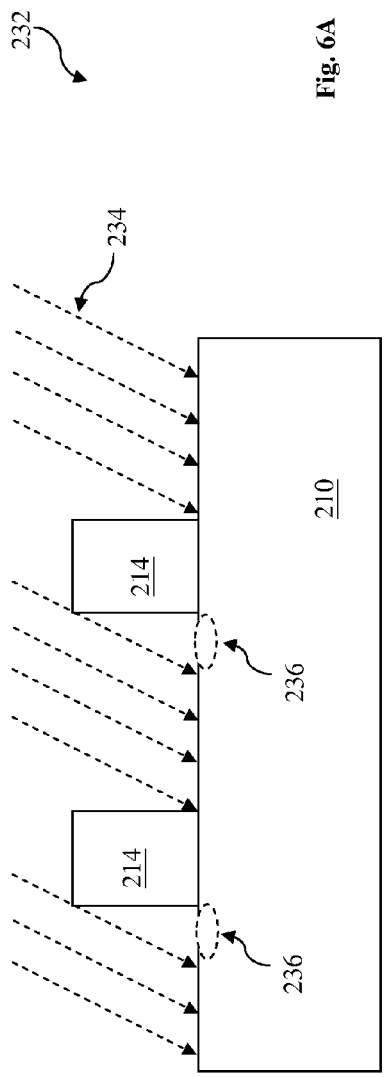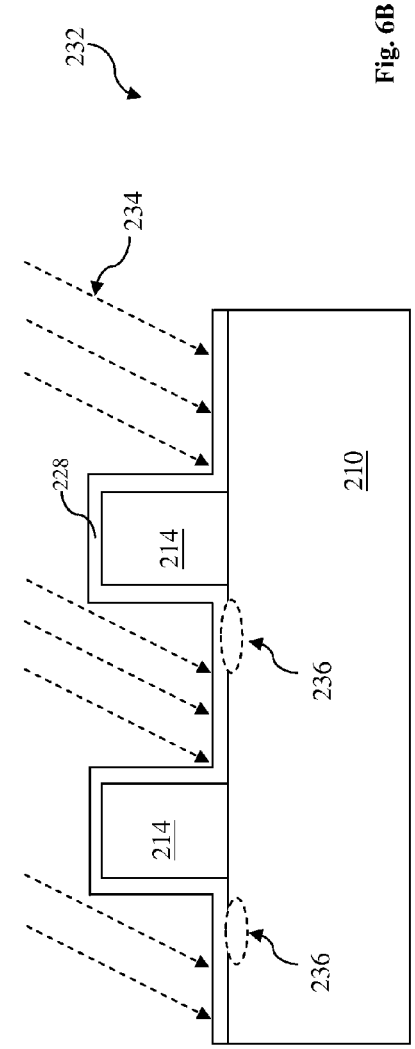

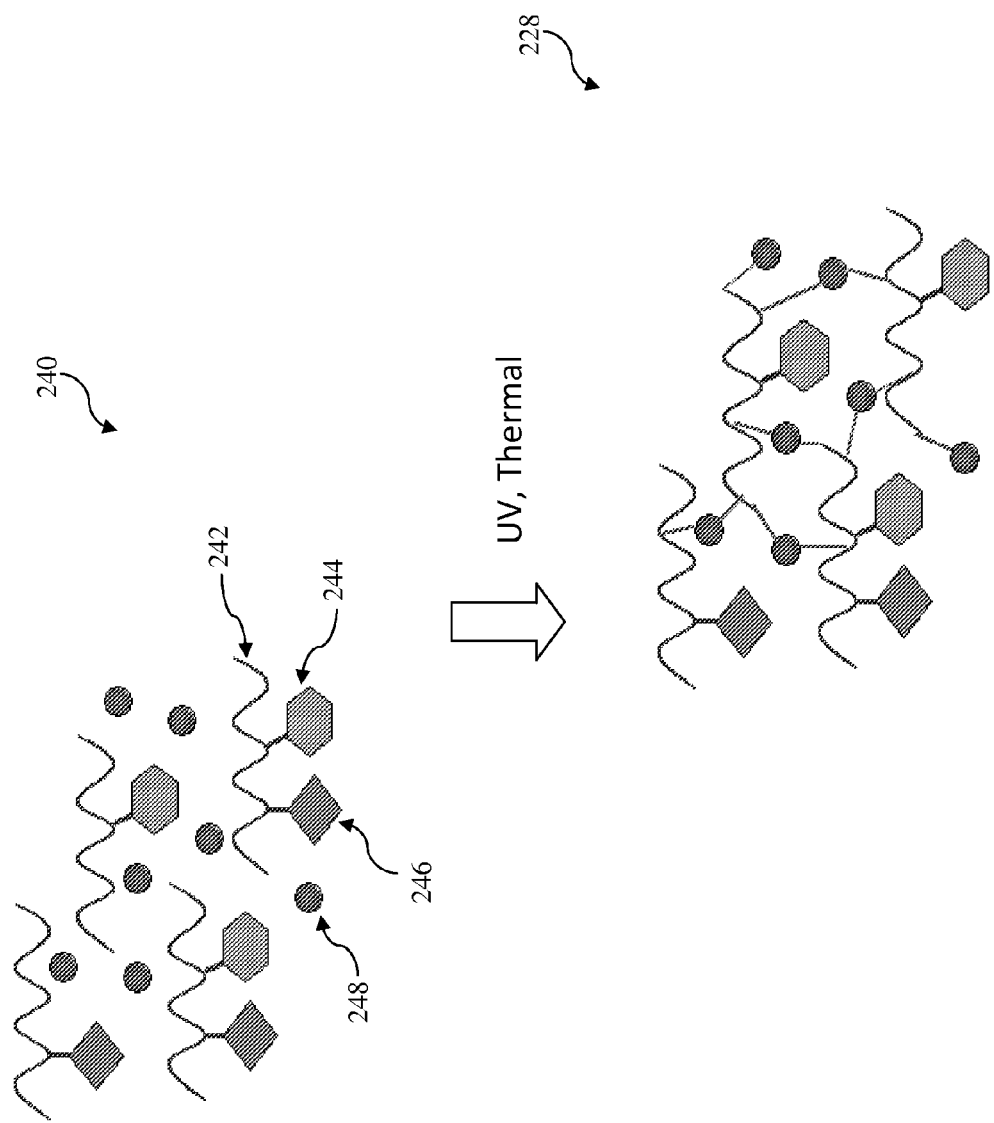

METHOD OF LITHOGRAPHY PROCESS WITH AN UNDER ISOLATION MATERIAL LAYER

BACKGROUND

A patterned photoresist layer is formed by a lithography process and is used to pattern various material layers during integrated circuit (IC) fabrication. However, the photoresist scum may be generated during the lithography process. The scum may change critical dimension (CD) and cause the deviation of the patterned IC features, which may further introduce performance and reliability issues and even device failures.

Semiconductor technologies are continually progressing to smaller feature sizes, down to 65 nanometers, 45 nanometers, and below. The scum associated issues are more serious when the CD is smaller. Maintaining a desired CD is even more challenge. Therefore, what is needed is a lithography process to address the above issues.

BRIEF DESCRIPTION OF THE DRAWINGS

Aspects of the present disclosure are best understood from the following detailed description when read in conjunction with the accompanying figures. It is noted that, in accordance with the standard practice in the industry, various features are not drawn to scale. In fact, the dimensions of various features may be arbitrarily increased or reduced for clarity of discussion.

FIGS. 6A and 6B are sectional side views of a semiconductor structure illustrating implant shadow effect in an ion implantation process.

FIG. 7 is a schematic view of a thin material layer used by the method of FIG. 1 and disposed in the semiconductor structure of FIGS. 2-5, constructed according to aspects of the present disclosure in various embodiments.

DETAILED DESCRIPTION

Figure 1:
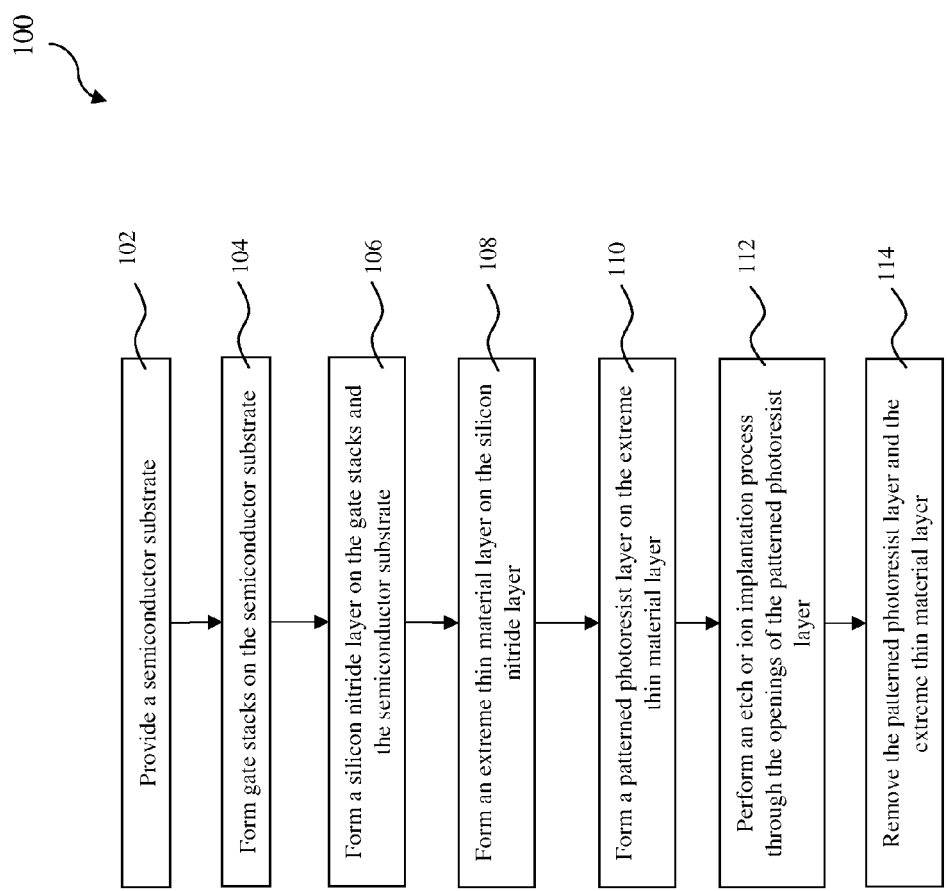
FIG. 1 is a flowchart showing one embodiment of a method for integrated circuit fabrication.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In one lithography process for patterning a semiconductor substrate, a photoresist (or resist) layer is coated on the substrate; then an ultraviolet (UV) beam is applied to the resist layer during an exposure process, generating acid in the exposed resist. However, the light intensity decreases toward the substrate due to the light absorption by the resist component (such as the photo acid generator) or topography issue, resulting in the corresponding resist layer that has an acid distribution profile with rich acid in upper portion and weak acid in lower portion. After post exposure baking (PEB) and developing by a basic solution, an opening is revealed with a top rounding (T-shape) and/or footing. In one example where the resist material is coated on a silicon nitride layer, the silicon nitride may react with the resist to form additional scum, which further degrades the patterned resist layer with more defects/scum issues.

FIG. 1 is a flowchart showing one embodiment of a method 100 for integrated circuit (IC) fabrication. FIGS. 2 through 5 are sectional side views of a semiconductor structure 200 formed by the method 100, at various fabrication stages. FIGS. 6A and 6B are sectional side views of a semiconductor structure illustrating implant shadow effect in an ion implantation process. FIG. 7 is a schematic view of a thin material layer constructed according to aspects of the present disclosure in various embodiments. With reference to FIGS. 1 through 7, the method 100 and the semiconductor structure 200 are described below.

Figure 2:
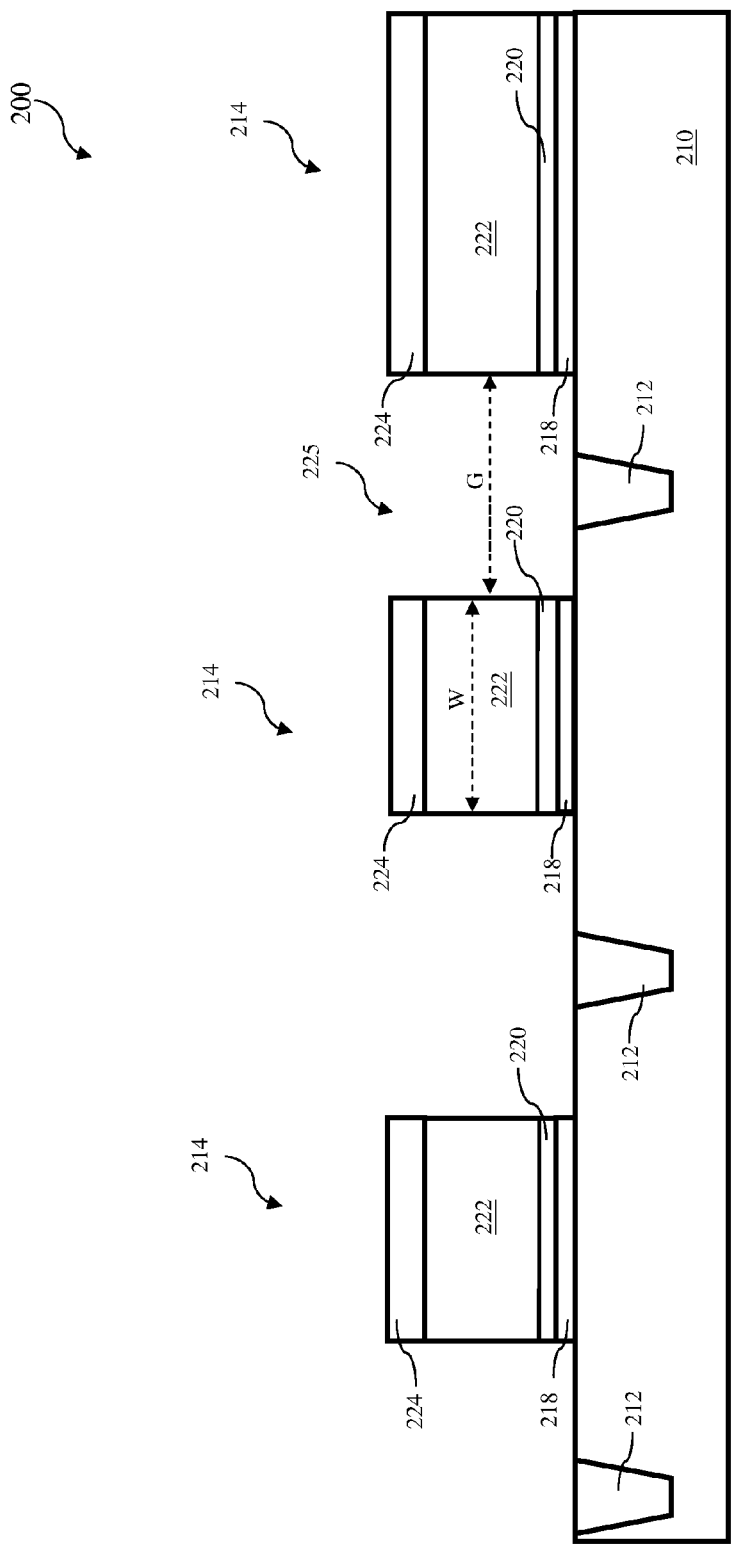
FIGS. 2 through 5 are sectional side views of one embodiment of a semiconductor structure formed by the method of FIG. 1, during various fabrication stages.

The method 100 begins at step 102 with a semiconductor structure 200 illustrated in FIG. 2. The semiconductor structure 200 includes a substrate 210, such as a silicon wafer. The substrate 210 may alternatively be made of other suitable semiconductor material, including Ge, SiGe, or GaAs. Further, the substrate 210 may be made of another suitable elementary semiconductor such as diamond; a suitable compound semiconductor such as silicon carbide, indium arsenide, or indium phosphide; or a suitable alloy semiconductor such as silicon germanium carbide, gallium arsenic phosphide, or gallium indium phosphide. The substrate 210 may alternatively be a non-semiconductor material, such as a glass substrate for thin-film-transistor liquid crystal display (TFT-LCD) devices.

The semiconductor structure 200 also includes various isolation features such as shallow trench isolation (STI) 212 formed in the substrate. The STI features 212 are formed in the substrate 210 to define various active regions and to separate various devices formed in respective active regions. The formation of the STI features includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. In one embodiment, the STI feature is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and removing silicon nitride (or silicon oxynitride) to leave the STI structure.

The semiconductor substrate 210 also includes various doped regions such as n-wells and p-wells formed in active regions. In one embodiment, the semiconductor substrate 210 includes various active regions for field-effect transistors (FETs). In another embodiment, the semiconductor substrate 210 may alternatively or additionally include other devices, such as polysilicon resistors.

The method 100 proceeds to step 104 by forming gate stacks 214 on the substrate, as illustrated in FIG. 2. The gate stacks 214 are disposed on the active regions. The gate stacks 214 each include a gate dielectric feature and a gate electrode disposed on the gate dielectric feature. The formation of the gate stacks 214 includes deposition and etch. The gate stacks 214 are further described according to one embodiment in terms of composition, configuration and formation.

Various gate material layers are deposited on the substrate 210. In one example, the gate material layers include a dielectric material layer 220 and a conductive layer 222, such as polycrystalline silicon (or polysilicon). In the present embodiment, the dielectric material layer 220 includes a high-k dielectric material layer. The conductive layer 222 alternatively or additionally may include amorphous silicon. The high-k dielectric layer 220 includes a dielectric material having the dielectric constant higher than that of thermal silicon oxide, which is about 3.9. In one example, the high-k dielectric layer 220 includes hafnium oxide (HfO). In various examples, the high-k dielectric layer 220 includes metal oxide, metal nitride, or combinations thereof.

In one embodiment, the gate material layers include multi-layer dielectric materials, such as an interfacial layer 218 (e.g., silicon oxide) and a high k dielectric material layer 222 disposed on the interfacial layer. In another embodiment, a hard mask layer 224, such as silicon nitride (SiN) or silicon oxide (SiO2), is further formed on the gate material layers for gate patterning. In various embodiments, the interfacial layer 218 may be formed by chemical oxide technique, thermal oxide procedure, atomic layer deposition (ALD) or chemical vapor deposition (CVD). The high k dielectric material layer 220 may be formed by CVD, ALD, plasma enhanced CVD (PE CVD), or plasma enhanced ALD (PEALD). The polysilicon layer 222 may be formed using CVD with precursor silane (SiH4) or other silicon based precursor. The hard mask layer (SiN or SiO2) may be formed by CVD or other suitable technique.

Then the gate material layers are patterned to form various gate stacks by an etch process. The patterning of the gate material layers can be achieved by a lithography process and/or an etch process. For example, a patterned photoresist layer is formed on the hard mask layer 224 defining various resistor regions and gate regions, using a photolithography process including photoresist coating, soft baking, exposing, post-exposure baking (PEB), developing, and hard baking. Then, the hard mask layer 224 is etched through the openings of the patterned photoresist layer, forming a patterned hard mask. The gate material layers are further etched using the patterned hard mask, forming the various resistors and gate stacks. The patterned photoresist layer is removed thereafter using a suitable process, such as wet stripping or plasma ashing. Alternatively, if the hard mask layer is not present, then the patterned photoresist layer is directly utilized as an etch mask to etch the gate material layers.

Other steps may follow the formation of the gate stacks. In one example, a light doped drain (LDD) features are formed in the substrate 210 by an ion implantation process. Then, gate spaces are formed on the sidewalls of the gate stacks by a procedure including dielectric deposition and anisotropic etch, such as plasma etch.

As illustrated in FIG. 2, the gate stacks 214 in the semiconductor structure 200 are spaced away from each other in a first direction, forming a trench (or a gap) 225 between the adjacent gate stacks 214. The trench 225 has a width G defined in the first direction. The width of the gate stacks is defined in the first direction as W. The gate stacks 214 are oriented in a second direction perpendicular to the first direction.

Figure 3:
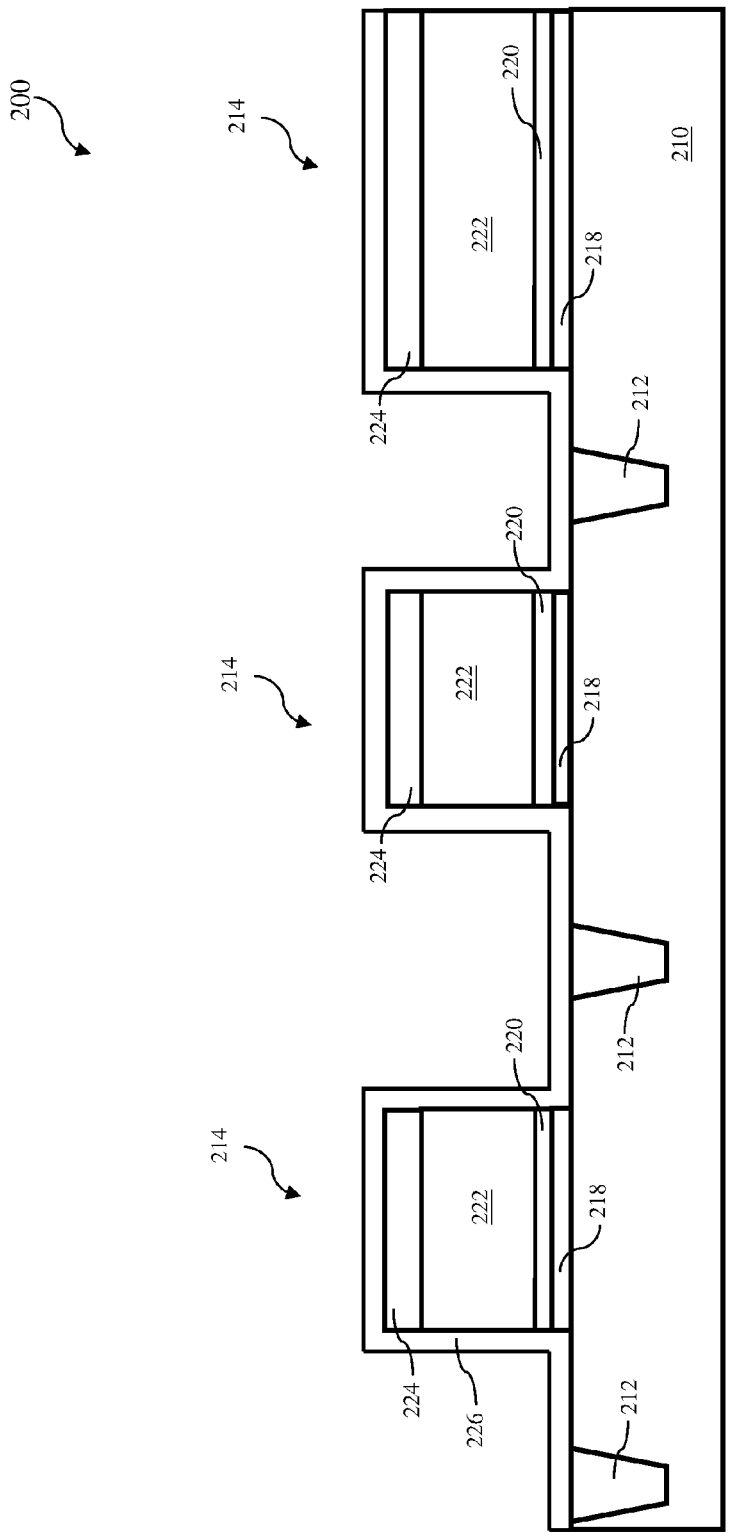

Referring to FIGS. 1 and 3, the method 100 proceeds to step 106 by forming a nitrogen-containing layer 226. In the present embodiment, the nitrogen-containing layer 226 includes silicon nitride (SiN). The nitrogen-containing layer 226 is formed by a suitable technique, such as CVD. In one example, the nitrogen-containing layer 226 has a thickness ranging from about 100 angstrom to about 150 angstrom. The nitrogen-containing layer 226 is disposed on the substrate 210. Particularly, the nitrogen-containing layer 226 is disposed on top-surfaces and sidewalls of the gate stacks 214. The nitrogen-containing layer 226 is substantially conformal to the gate stacks 214, as illustrated in FIG. 3.

The nitrogen-containing layer 226 may be used as a capping layer for strain effect or used as a contact etch stop layer (CESL) to serve as an etch stop layer during a subsequent etch process to form contact hole. Alternatively or additionally, the nitrogen-containing layer 226 may be used as an ion implantation mask.

Figure 4:
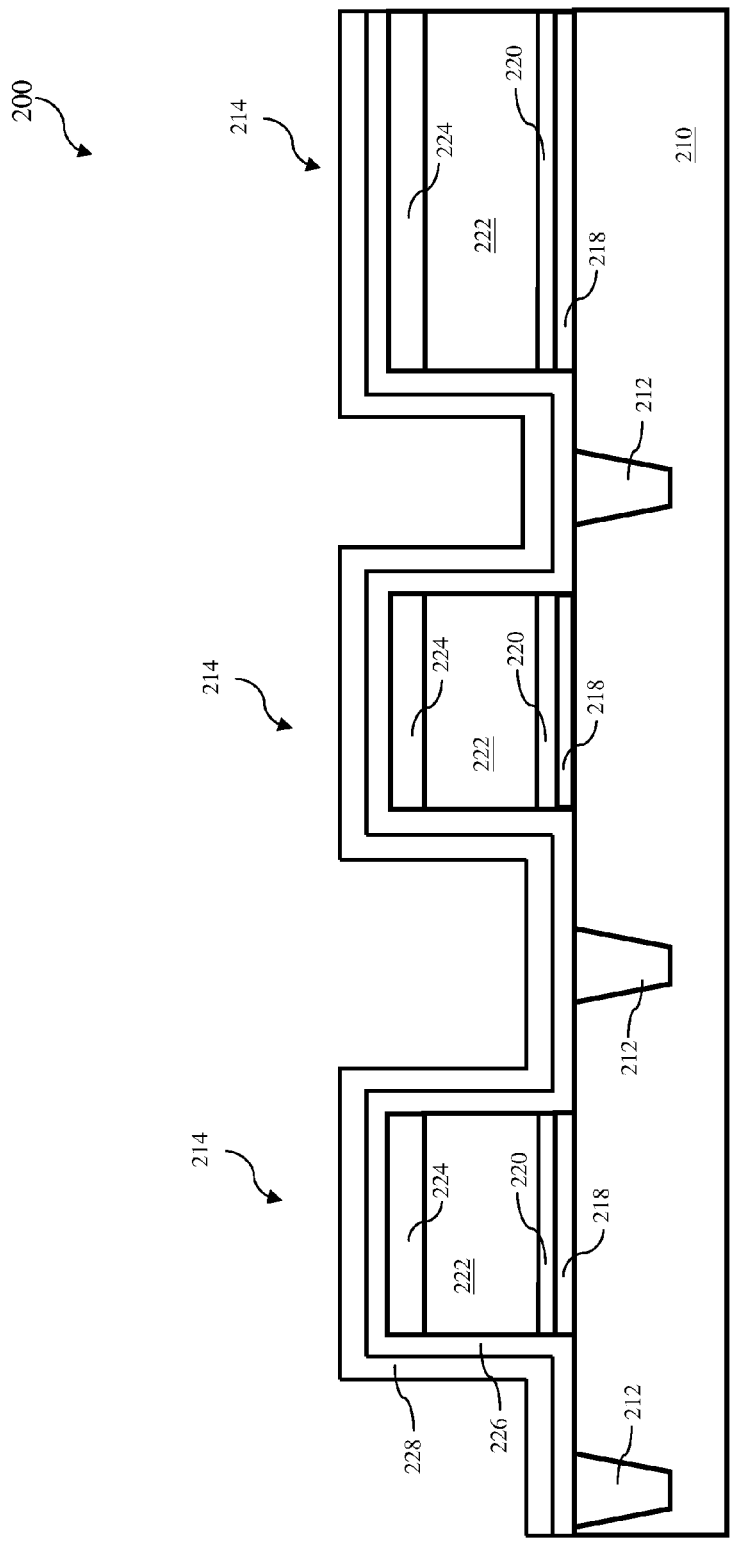

Referring to FIGS. 1 and 4, the method 100 proceeds to step 108 by forming a material layer 228 on the nitrogen-containing layer 226. The material layer 228 is extremely thin and is conformal to the nitrogen-containing layer 226 such that the trench 225 after the step 108 is not significantly changed by the material layer 228. The material layer 228 being conformal means that the material layer 228 has a same profile as those of the nitrogen-containing layer 226 and the gate stacks 214 so the trench 225 remains instead of being substantially filled by the material layer 228. In one embodiment, the material layer 228 has a thickness T substantially less than G/2. In furtherance of the embodiment, a ratio between the thickness T of the material layer 228 and the trench width G as T/G ranges between about 5% and 10%. In one example, the material layer 228 has a thickness less than about 100 angstrom. In another embodiment, the material layer 228 has a thickness greater than about 10 angstrom and less than about 100 angstrom. The thickness is greater than about 10 angstrom such that the material layer 228 is able to effectively protect the nitrogen-containing layer 226 from reacting with subsequently formed resist layer, causing resist scum. This is also referred to as poison effect. The thickness is less than about 100 angstrom such that the gap between the gate stacks is substantially open without significantly impacting the subsequent process in term of device performance. For example, when an angled ion implantation process is applied to the substrate through the gap between the gate stacks, the areas of the substrate closed to the gate stacks are blocked from the ion implantation, changing the implantation doping profile. This is referred to as shadow effect. This is further explained below with reference to FIGS. 6A and 6B.

In another embodiment, the material layer 228 includes a dielectric material. In yet another embodiment, the material layer 228 includes a polymeric material having an acrylic group such that the material layer 228 has an extreme low etch loading effect. In the present embodiment, the material layer 228 includes a bottom anti-reflective coating (BARC) material. In furtherance of the embodiment, the material layer 228 includes a mixture of various monomers, cross-linker and solvent. In one example, the material layer 228 is photo-sensitive by incorporating a photo-sensitive chemical. In another example, the material layer 228 is alternatively non-photo-sensitive.

In other examples, the material layer 228 is acid, basic or normal. The bottom profile of the subsequent formed resist layer is further controlled by the acidity of the material layer 228. By controlling the acidity of the material layer 228, the chemical reaction between the resist layer and the material layer 228 helps to remove the resist layer in the trench bottom (within the exposed region). For example, the acid in the material layer 228 diffuses to the resist layer can help the resist layer in the trench bottom within the exposed region to be fully developed and removed during the development without footing issue.

In one embodiment, the material layer 228 includes a mixture of propylene glycol methyl ether (PGME), propylene glycol methyl ether acetate (PGMEA), ethyl lactate (EL), cross-linker, and solvent. In another embodiment, the solvent in the material layer 228 includes propylene glycol monomethyl ether and propylene glycol monomethyl ether acetate. Propylene glycol monomethyl ether and propylene glycol monomethyl ether acetate in the material layer 228 are mixed in a certain ratio for optimized coating effect.

The composition and thickness of the material layer 228 are tuned to provide effective isolation of the nitrogen-containing layer 226 from subsequent disposed photoresist. In a particular example, the material layer 228 is tuned with a thickness enough for effective isolation but is still extreme thin (less than about 100 angstrom in the present embodiment) such that an implant shadow effect by the material layer 228 is minimized. Implant shadow effect is illustrated in FIGS. 6A and 6B and explained below. FIGS. 6A and 6B are sectional side views of a semiconductor structure 232 simplified to illustrate the implant shadow effect. The semiconductor structure 232 includes a substrate 210 and gate stacks 214 formed on the substrate. The nitrogen-containing layer may present but is not shown here for simplicity. As shown in FIG. 6A, when an ion implantation process 234 with a tilt angle (such as pocket implantation) is applied to the substrate 210, the gate stacks may block areas 236 of the substrate 210 from being implanted. This effect is referred to as implant shadow effect and those blocked areas are referred to as shadow areas 236. When the material layer 228 is disposed on the substrate 210 and the gate stacks 214 as shown in FIG. 6B, the implant shadow effect is increased and the shadow areas 238 are increased. Accordingly, the device performance may be degraded. Therefore, the material layer 228 is designed to be extreme thin such that the additional implant shadow effect by the material layer 228 is neglectable or minimized in term of device performance (or tolerable according to specification). In other words, the device performance degradation due to the additional implant shadow effect by the extreme thin material layer is acceptably small or neglectable. In the present embodiment, it means that the thickness of the material layer 228 is less than about 100 angstrom.

In the present embodiment, the extreme thin material layer 228 is formed by spin coating. The pre-solution is applied to the substrate 210 by spin coating and then is cured to form the material layer 228 by thermal energy (such as baking at a suitable temperature), ultraviolet (UV) energy, or other suitable technique. The composition of the pre-solution is properly chosen and the concentration of the pre-solution is tuned to achieve an extreme thin thickness that is less than about 100 angstrom in the present embodiment. In one embodiment, the composition is chosen according to the molar mass to achieve extreme thin coating. For example, the average molecular weight of the material layer 228 is greater than about 100,000 in the present embodiment. In another embodiment, the composition is chosen according to the viscosity of the pre-solution to achieve extreme thin coating. The viscosity is low enough such that the pre-solution spreads into an extreme thin film during the spin coating. In yet another embodiment, the concentration of the pre-solution is further tuned for the extreme thin coating. For example, the concentration of the pre-solution is diluted to further reduce the viscosity in order to have the spin coated material layer extremely thin.

In one example, the pre-solution to form the material layer 228 includes propylene glycol methyl ether (PGME), propylene glycol methyl ether acetate (PGMEA), ethyl lactate (EL), cross-linker, and solvent. The more solvent or other thinner is added to dilute the pre-solution such that the molar mass of the material layer 228 is less than about 1 g/ml.

The spin rate of the spin coating to dispose the pre-solution is also tuned to achieve the extreme thin thickness. In one example, the spin rate of the spin coating is greater than about 1000 rpm such that the thickness of the material layer 228 is less than about 100 angstrom. In another example, the spin rate of the spin coating ranges between about 1000 rpm and about 2200 rpm. The unit rpm stands for revolution per minute.

FIG. 7 is a schematic views of the material layer 228 before and after the cure constructed according to aspects of the present disclosure in one or more embodiments. Before the cure, the material layer 228 is in a solution state, referred to as pre-solution 240. The pre-solution 240 is applied to the nitrogen-containing layer 226 by spin coating. The pre-solution 240 includes polymer backbone 242. The polymer backbone 242 is further chemically boned with a chromophore 244 and further chemically boned with a chemical group 246 for etching resistance. The pre-solution 240 also includes cross-linker 248. In one embodiment when thermal energy is used for curing, the average molecular weight of the pre-solution 240 ranges between about 3000 and about 5000. In another embodiment when UV energy is used for curing, the average molecular weight of the pre-solution 240 is less than about 1000. The pre-solution 240 further includes a solvent such that the above mixture in the pre-solution is soluble in the solvent.

After the pre-solution 240 is applied to the substrate 210 by spin coating and is then cured, the material layer 228 is formed and is not soluble in the solvent. The average molecular weight of the material layer 228 is greater than about 100,000 in the present embodiment.

Figure 5:
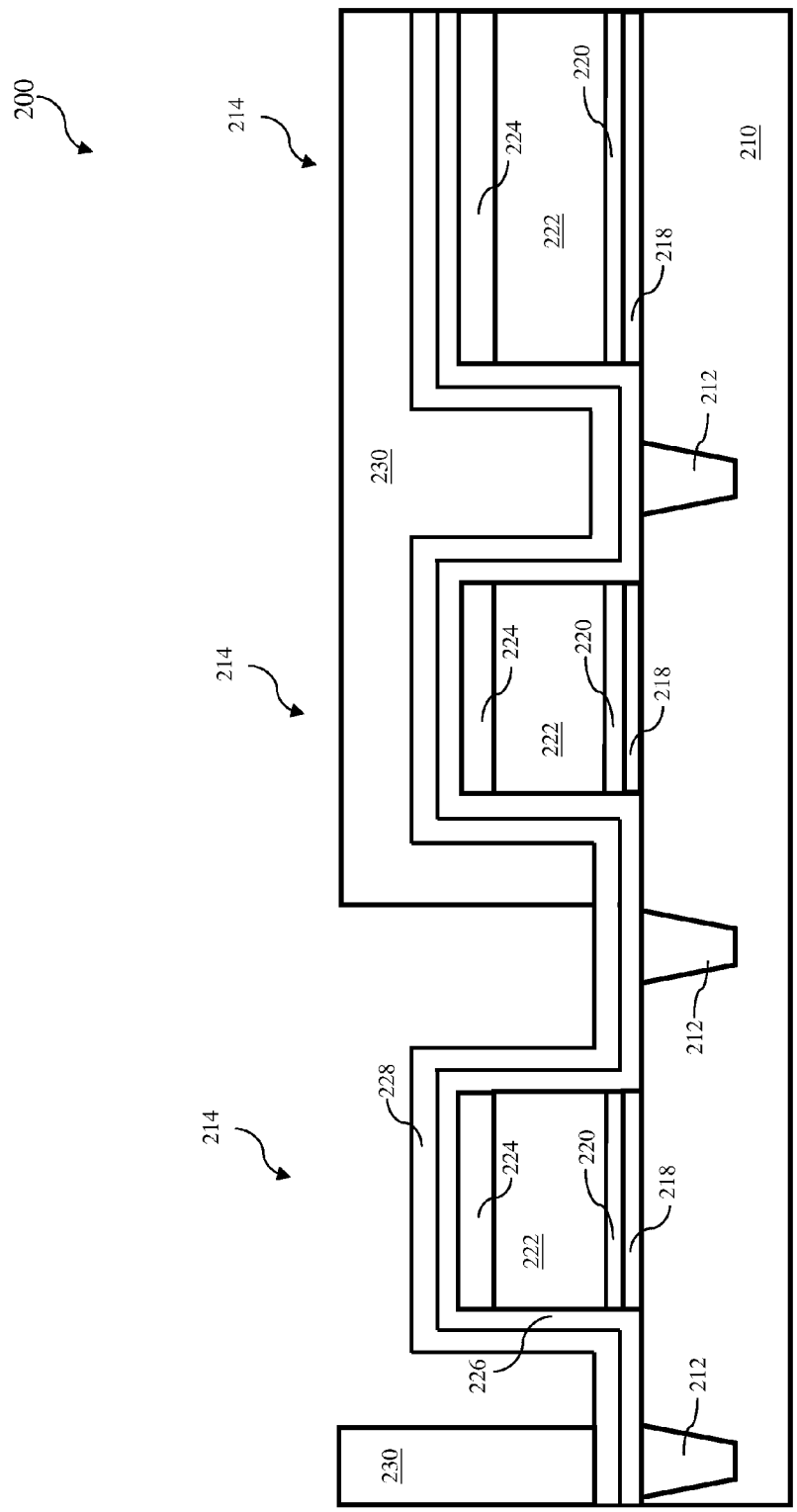

Referring to FIGS. 1 and 5, the method 100 proceeds to step 110 by forming a patterned photoresist layer (or resist layer) 230 on the substrate 210. In the present embodiment, the photoresist is formed on the material layer 228. Resist layer 230 is either a positive-type or a negative-type photoresist. Resist layer 230 is coated by a proper technique, such as spin coating. Resist layer 230 is formed to have a suitable thickness with enough etch resistance (or implantation resistance). In one example, the resist layer 230 has a thickness ranging between about 1000 angstroms and about 2000 angstroms.

In the present embodiment, the resist layer 230 utilizes a chemically amplified (CA) resist material. The resist layer 230 includes a polymeric material as a matrix to provide various properties of the photoresist, such as resisting etch or ion implantation. In one example, the polymeric material of the resist layer 230 includes a polymer resin. In one embodiment, a positive CA resist material includes a polymer material that turns soluble to a developer, such as a base solution, after the polymer material is reacted with acid. Alternatively, the CA resist material can be negative and include a polymer material that turns insoluble to a developer after the polymer is reacted with acid.

The resist layer 230 further includes a solvent in the polymer. The solvent may be partially evaporated by a soft baking process. The resist layer 230 also includes a photosensitive component that is sensible to a radiation energy, such as ultraviolet (UV) light or deep ultra-violet (DUV) light in one example. In one example, the photosensitive component of the resist layer 114 includes photo-acid generator (PAG) distributed in the polymeric material. The PAG generates acid upon being exposed to proper UV light beam.

After the resist layer 230 is coated on the substrate 210, a soft baking process is implemented to partially drive out the solvent from the resist layer 230. The resist coating and soft baking may performed in one or more suitable tools, such as a track designed and configured to perform various resist-related processes including coating and baking. A lithography exposure process is then applied to the resist layer 230. In one embodiment of the exposure process, the resist layer 230 is exposed to a radiation energy (such as UV light) through a photomask (mask or reticle) having a predefined pattern. As examples, the radiation energy may include a 248 nm beam by Krypton Fluoride (KrF) excimer lasers or a 193 nm beam by Argon Fluoride (ArF) excimer lasers. In one embodiment, the exposure process utilizes an immersion photolithographic technique. In this case, an immersion fluid is disposed between the semiconductor structure 200 and the projection lens of the lithography apparatus. The immersion fluid may include de-ionized water (DI water or DIW).

Then a post-exposure-baking (PEB) process is applied to the exposed resist layer. A developing process is then applied to the resist layer to form a patterned resist layer 230. The patterned resist layer 230 includes one or more openings that expose the material layer 228 within the openings. During the developing process, a suitable developer (or developing solution) is applied to the resist layer. In one example, the developer includes tetramethyl ammonium hydroxide (TMAH) solution. In another example, the developer includes other proper chemicals, such as negative tone developing solution such that the positive tone resist within unexposed regions is removed or the negative tone resist within exposed regions is removed thereby. In one example, the developer is dispensed to the resist layer by spray or puddle. In another example, the developing process further includes one or more rinsing steps to remove the developer and clean the patterned resist layer by a suitable rinsing liquid, such as de-ionized water (DI-water). In yet another example, a hard baking step may further follow to remove the solvent and harden the patterned resist layer 230.

Since the resist layer 230 is isolated from the nitrogen-containing layer 226 by the material layer 228, the reaction between the resist and the nitrogen-containing material is effectively eliminated to avoid the poison effect. The resist scum generated by such reaction is eliminated as well. Accordingly, various defects, such as resist scum and t-shape noise, are substantially reduced or eliminated. Therefore, the material layer 228 is also referred to as under isolation material layer.

Other fabrication processes may be implemented using the patterned resist layer 230 as a mask. For example, the method 100 includes a step 112 by performing an etch or ion implantation process through the openings of the patterned resist layer 230. In one example, an etch process is applied to the substrate using the patterned resist layer 116 as an etch mask. In another example, an ion implantation process is applied to the substrate using the patterned resist layer 230 as an implantation mask. In various embodiments, the ion implantation process may include an ion implantation to form heavily doped source and drain (S/D) features or pocket implantation.

The method 100 further includes a step 114 by removing the patterned resist layer 230 by wet stripping or plasma ashing. Particularly, the material layer 228 is removed as well by the same removing process to remove the patterned resist layer 230. Thus, the manufacturing cost is reduced and fabrication is simplified. In one example, the wet stripping process is applied to remove both the patterned resist layer 230 and the material layer 228 by a wet chemical. In another example, the plasma ashing process is applied to remove both the patterned resist layer 230 and the material layer 228. Therefore, the fabrication cost cycle time are reduced and the process flow is simplified.

Other fabrication processes may be implemented before, during and/or after the method 100. In one embodiment, the silicon nitride layer 226 may be used as contact etch stop layer (CESL).

The method 100 described above is according to various embodiments. Other changes, substitutions and alterations may be made herein without departing from the spirit and scope of the present disclosure. For example, the resist layer 230 may use different photosensitive material and may be a positive-tone or a negative-tone resist. For example, the resist material is negative-tone resist while the developer is chosen to be negative-tone developer. In an alternative example, the resist material is positive-tone resist while the developer is chosen to be negative-tone developer. In yet another example, the resist material is negative-tone resist while the developer is chosen to be positive-tone developer.

In one embodiment, the lithography process includes processing steps of resist coating, soft baking, exposing, PEB process, developing, and hard baking. In other embodiments, the lithography process may further include other steps, such as rinsing, cleaning or other baking steps.

In another embodiment, the radiation beam in the lithography exposure process may include other proper beams and use other exposure technologies. For example, the radiation beam may include electron-beam (e-beam) to be applied to the resist layer by writing or projection. In this case, the resist material is chosen and designed to be sensitive to e-beam. For example, the resist material may include polymethyl methacrylate (PMMA). When e-beam direct write mode is used, the photomask (or reticle) may be eliminated during the lithography exposure process.

Thus, the present disclosure provides one embodiment of a method for forming an integrated circuit pattern. The method includes forming gate stacks on a substrate, two adjacent gate stacks of the gate stacks being spaced away by a dimension G; forming a nitrogen-containing layer on the gate stacks and the substrate; forming a dielectric material layer on the nitrogen-containing layer, the dielectric material layer having a thickness T substantially less than G/2; coating a photoresist layer on the dielectric material layer; and patterning the photoresist layer by a lithography process.

In one embodiment of the method, the dielectric material layer is conformal to the gate stacks; and the thickness T of the dielectric material layer ranges between about 5% G and about 10% G.

In another embodiment, the thickness T of the dielectric material layer is greater than about 10 angstrom to effectively isolate the nitrogen-containing layer from the photoresist layer without chemical reaction and is less than about 100 angstrom to minimize shadow effect during a subsequent ion implantation process.

In yet another embodiment, the dielectric material layer includes a bottom anti-reflective coating (BARC) material. In yet another embodiment, the dielectric material layer includes a polymeric material having an acrylic group.

In yet another embodiment, the dielectric material layer includes a mixture of propylene glycol methyl ether (PGME), propylene glycol methyl ether acetate (PGMEA), ethyl lactate (EL), cross-linker, and solvent. In furtherance of the embodiment, the solvent includes propylene glycol monomethyl ether and propylene glycol monomethyl ether acetate.

In another embodiment, the forming a dielectric material layer includes applying a liquid chemical with a molar mass less than about 1 g/ml to the silicon nitride layer by spin coating; and curing the liquid chemical to form the extreme thin dielectric material layer by one of thermal energy and ultraviolet (UV) energy.

In yet another embodiment, the spin-coating has a spin rate ranging between about 1000 revolutions per minute (rpm) and about 2200 rpm; and the spin rate is tuned such that a thickness of the dielectric material layer is reduced below about 100 angstrom.

In yet another embodiment, the method further includes performing an ion implantation process to the substrate through openings of the photoresist layer; and thereafter removing the photoresist layer. In yet another embodiment, the removing the photoresist layer includes removing the photoresist layer by a wet chemical in a stripping process; and removing the dielectric material layer by the wet chemical in the stripping process.

In yet another embodiment, the forming a dielectric material layer includes forming the dielectric material layer on sidewalls of the gate stacks such that a trench is defined by the dielectric material layer.

The present disclosure also provides another embodiment of a method of forming an integrated circuit pattern. The method includes forming gate stacks on a semiconductor substrate; forming a silicon nitride layer on the gate stacks and the semiconductor substrate, the silicon nitride layer being conformal to the gate stacks; forming a material layer on the silicon nitride layer, the material layer being conformal to the silicon nitride layer; coating a photoresist layer on the material layer; patterning the photoresist layer by a lithography process; performing one of etch and ion implantation to the semiconductor substrate through openings of the photoresist layer; and removing the photoresist layer and the material layer by a chemical.

In one embodiment, two adjacent gate stacks of the gate stacks are spaced away from each other by a dimension G; and the material layer has a thickness T substantially less than G/2.

In another embodiment, the material layer includes a mixture of propylene glycol methyl ether (PGME), propylene glycol methyl ether acetate (PGMEA), ethyl lactate (EL), cross-linker, and solvent.

In yet another embodiment, the forming a material layer includes diluting the mixture by the solvent such that a molar mass of the mixture is less than about 1 g/ml; applying the mixture on the silicon nitride layer by spin coating; and curing the mixture to form the material layer by one of thermal energy and ultraviolet (UV) energy.

In yet another embodiment, the spin-coating has a spin rate tuned greater than about 1000 rpm such that the material layer has a thickness less than about 100 angstrom.

The present disclosure also provides another embodiment of a method of forming an integrated circuit pattern. The method includes forming two gate stacks on a semiconductor substrate, the two gate stacks being distanced from each other by a dimension G; forming a nitrogen-containing material layer on the gate stacks and the semiconductor substrate, the nitrogen-containing material layer being conformal to the gate stacks; forming a polymeric layer on the nitrogen-containing material layer, wherein the polymeric layer has an acrylic group and has a thickness T substantially less than G/2; and forming a patterned photoresist layer on the polymeric layer.

In one embodiment, the forming a polymeric layer includes forming a bottom anti-reflective coating (BARC) layer by spin coating such that the thickness T ranges between about 10 angstrom and about 100 angstrom.

In another embodiment, the polymeric layer includes propylene glycol methyl ether (PGME), propylene glycol methyl ether acetate (PGMEA), ethyl lactate (EL), cross-linker, and solvent; and the solvent includes propylene glycol monomethyl ether and propylene glycol monomethyl ether acetate.

The foregoing has outlined features of several embodiments so that those of ordinary skill in the art may better understand the foregoing detailed description. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming an integrated circuit pattern, the method comprising:
    forming gate stacks on a substrate, two adjacent gate stacks of the gate stacks being spaced away by a dimension G;
    forming a nitrogen-containing layer on the gate stacks and the substrate;
    applying a liquid chemical to the nitrogen-containing layer;
    curing the liquid chemical to form a dielectric material layer by one of thermal energy and ultraviolet (UV) energy, the dielectric material layer having a thickness T substantially less than G/2;
    coating a photoresist layer on the dielectric material layer; and
    patterning the photoresist layer by a lithography process.

2. The method of claim 1, wherein:
    the dielectric material layer is conformal to the gate stacks; and
    the thickness T of the dielectric material layer ranges between about 5% G and about 10% G.

3. The method of claim 1, wherein the thickness T of the dielectric material layer is greater than about 10 angstroms to effectively isolate the nitrogen-containing layer from the photoresist layer without chemical reaction and is less than about 100 angstroms to minimize shadow effect during a subsequent ion implantation process.

4. The method of claim 1, wherein the dielectric material layer includes a bottom anti-reflective coating (BARC) material.

5. The method of claim 1, wherein the dielectric material layer includes a polymeric material having an acrylic group.

6. The method of claim 1, wherein the dielectric material layer includes a mixture of propylene glycol methyl ether (PGME), propylene glycol methyl ether acetate (PGMEA), ethyl lactate (EL), cross-linker, and solvent.

7. The method of claim 6, wherein the solvent includes propylene glycol monomethyl ether and propylene glycol monomethyl ether acetate.

8. The method of claim 1, wherein the liquid chemical has a molar mass less than about 1 g/ml and applying the liquid chemical to the nitrogen-containing layer is by spin coating.

9. The method of claim 8, wherein:
    the spin-coating has a spin rate ranging between about 1000 revolutions per minute (rpm) and about 2200 rpm; and
    the spin rate is tuned such that a thickness of the dielectric material layer is reduced below about 100 angstroms.

10. The method of claim 1, further comprising:
performing an ion implantation process to the substrate through openings of the photoresist layer; and
thereafter removing the photoresist layer.

11. The method of claim 10, wherein the removing the photoresist layer includes:
removing the photoresist layer by a wet chemical in a stripping process; and
removing the dielectric material layer by the wet chemical in the stripping process.

12. The method of claim 1, wherein the forming the dielectric material layer includes forming the dielectric material layer on sidewalls of the gate stacks such that a trench is defined by the dielectric material layer.

13. A method of forming an integrated circuit pattern, the method comprising:
forming gate stacks on a semiconductor substrate;
forming a silicon nitride layer on the gate stacks and the semiconductor substrate, the silicon nitride layer being conformal to the gate stacks;
forming a material layer on the silicon nitride layer, the material layer being conformal to the silicon nitride layer;
coating a photoresist layer on the material layer;
patterning the photoresist layer by a lithography process;
performing one of etch and ion implantation to the semiconductor substrate through openings of the photoresist layer; and
removing the photoresist layer and the material layer by same removing process.

14. The method of claim 13, wherein:
adjacent two gate stacks of the gate stacks are spaced away from each other by a dimension G; and
the material layer has a thickness T substantially less than G/2.

15. The method of claim 13, wherein the material layer includes a mixture of propylene glycol methyl ether (PGME), propylene glycol methyl ether acetate (PGMEA), ethyl lactate (EL), cross-linker, and solvent.

16. The method of claim 15, wherein the forming the material layer includes:
diluting the mixture by the solvent such that a molar mass of the mixture is less than about 1 g/ml;
applying the mixture on the silicon nitride layer by spin coating; and
curing the mixture to form the material layer by one of thermal energy and ultraviolet (UV) energy.

17. The method of claim 16, wherein the spin-coating has a spin rate tuned greater than about 1000 rpm such that the material layer has a thickness less than about 100 angstroms.

18. A method of forming an integrated circuit pattern, the method comprising:
forming two gate stacks on a semiconductor substrate, the two gate stacks being distanced from each other by a dimension G;
forming a nitrogen-containing material layer on the gate stacks and the semiconductor substrate, the nitrogen-containing material layer being conformal to the gate stacks;
forming a polymeric layer on the nitrogen-containing material layer, wherein the polymeric layer has an acrylic group and has a thickness T substantially less than G/2; and
forming a patterned photoresist layer on the polymeric layer.

19. The method of claim 18, wherein the forming the polymeric layer includes forming a bottom anti-reflective coating (BARC) layer by spin coating such that the thickness T ranges between about 10 angstroms and about 100 angstroms.

20. The method of claim 18, wherein:
the polymeric layer includes propylene glycol methyl ether (PGME), propylene glycol methyl ether acetate (PGMEA), ethyl lactate (EL), cross-linker, and solvent; and
the solvent includes propylene glycol monomethyl ether and propylene glycol monomethyl ether acetate.

* * * * *